US007348126B2

(12) United States Patent
Vermeersch et al.

(10) Patent No.: US 7,348,126 B2
(45) Date of Patent: Mar. 25, 2008

(54) NEGATIVE WORKING, HEAT-SENSITIVE LITHOGRAPHIC PRINTING PLATE PRECURSOR

(75) Inventors: Joan Vermeersch, Deinze (BE); Marc Van Damme, Bonheiden (BE)

(73) Assignee: Agfa Graphics N.V., Mortsel (BE)

( * ) Notice: Subject to any disclaimer, the term of this patent is extended or adjusted under 35 U.S.C. 154(b) by 367 days.

(21) Appl. No.: 11/113,878

(22) Filed: Apr. 25, 2005

(65) Prior Publication Data

US 2005/0238994 A1 Oct. 27, 2005

Related U.S. Application Data

(60) Provisional application No. 60/579,618, filed on Jun. 15, 2004, provisional application No. 60/570,767, filed on May 13, 2004.

(30) Foreign Application Priority Data

Apr. 27, 2004 (EP) .................................. 04101766
Jun. 11, 2004 (EP) .................................. 04102654

(51) Int. Cl.
*G03C 1/76* (2006.01)
*G03F 7/038* (2006.01)
*G03F 7/20* (2006.01)
*G03F 7/30* (2006.01)

(52) U.S. Cl. ............................... 430/271.1; 430/270.1; 430/302; 430/325; 430/944

(58) Field of Classification Search ..................... None
See application file for complete search history.

(56) References Cited

U.S. PATENT DOCUMENTS

| | | | |
|---|---|---|---|
| 3,476,937 | A | 11/1969 | Vrancken |
| 3,971,660 | A | 7/1976 | Staehle |
| 4,045,232 | A | 8/1977 | Parkinson |
| 4,284,705 | A | 8/1981 | Phlipot et al. |
| 4,458,005 | A | 7/1984 | Mohr et al. |
| 4,840,713 | A | 6/1989 | Pliefke |
| 4,897,168 | A | 1/1990 | Boergerding et al. |
| 4,981,517 | A | 1/1991 | DeSanto, Jr. et al. |
| 5,156,723 | A | 10/1992 | Pliefke et al. |
| 5,163,368 | A | 11/1992 | Pensavecchia et al. |
| 5,174,205 | A | 12/1992 | Kline et al. |
| 5,229,253 | A | 7/1993 | Zertani et al. |
| 5,314,787 | A | 5/1994 | Elsaesser et al. |
| 5,637,441 | A | 6/1997 | Brenk et al. |
| 5,641,608 | A | 6/1997 | Grunwald et al. |
| 5,695,903 | A | 12/1997 | Elsaesser et al. |
| 6,190,825 | B1 | 2/2001 | Denzinger et al. |
| 2002/0117066 | A1 | 8/2002 | Kawamura et al. |
| 2002/0168582 | A1 | 11/2002 | Van Damme et al. |

FOREIGN PATENT DOCUMENTS

| | | | | |
|---|---|---|---|---|
| DE | 1447963 | | | 11/1968 |
| DE | 40 01 466 | A1 | | 7/1991 |
| DE | 44 17 907 | A1 | | 11/1995 |
| DE | 44 23 140 | A1 | | 1/1996 |
| EP | 0 291 760 | | | 11/1988 |
| EP | 0 292 801 | | | 11/1988 |
| EP | 0 537 633 | A1 | | 4/1993 |
| EP | 0 601 240 | A1 | | 6/1994 |
| EP | 0 625 728 | A2 | | 11/1994 |
| EP | 0 659 909 | A1 | | 6/1995 |
| EP | 0 770 494 | A2 | | 5/1997 |
| EP | 0 770 495 | A1 | | 5/1997 |
| EP | 0 770 496 | A1 | | 5/1997 |
| EP | 0 770 497 | A1 | | 5/1997 |
| EP | 0 800 928 | | | 10/1997 |
| EP | 0 823 327 | A2 | | 2/1998 |
| EP | 0 864 420 | A1 | | 9/1998 |
| EP | 0 881 096 | A1 | | 12/1998 |
| EP | 0 894 622 | A2 | | 2/1999 |
| EP | 0 901 902 | A2 | | 3/1999 |
| EP | 0 933 682 | A2 | | 8/1999 |
| EP | 1 029 667 | A1 | | 8/2000 |
| EP | 1 053 868 | A2 | | 11/2000 |
| EP | 1 093 934 | A1 | | 4/2001 |
| EP | 1 216 831 | | | 6/2002 |
| EP | 1 243 413 | A1 | | 9/2002 |
| FR | 2300354 | | | 9/1976 |
| GB | 1084070 | | | 9/1967 |
| GB | 1154749 | | | 5/1969 |
| GB | 1419512 | | | 12/1975 |
| JP | 2004-117534 | | * | 4/2004 |
| WO | WO 97/39894 | A1 | | 10/1997 |
| WO | WO 00/29214 | A1 | | 5/2000 |
| WO | WO 00/32705 | A1 | | 5/2000 |
| WO | WO 03/087942 | A1 | | 10/2003 |

OTHER PUBLICATIONS

Machine-assisted English translation of JP 2004-117534, provided by JPO.*
Search Report for EP 04102654 (Oct. 18, 2004).

* cited by examiner

*Primary Examiner*—Sin Lee
(74) *Attorney, Agent, or Firm*—Leydig, Voit & Mayer, Ltd.

(57) ABSTRACT

A negative-working lithographic printing plate precursor is disclosed comprising on a support having a hydrophilic surface or which is provided with a hydrophilic layer, a coating comprising an infrared absorbing agent, a first layer comprising an aqueous dispersion comprising hydrophobic thermoplastic polymer particles and a first hydrophobic binder, and a second layer located between said first layer and said support which comprises a second hydrophobic binder, characterized in that said first hydrophobic binder is a phenolic resin and said second hydrophobic binder is a polymer comprising at least one sulphonamide group.

11 Claims, No Drawings

NEGATIVE WORKING, HEAT-SENSITIVE LITHOGRAPHIC PRINTING PLATE PRECURSOR

CROSS-REFERENCE TO RELATED PATENT APPLICATIONS

This patent application claims the benefit of U.S. Provisional Patent Application Nos. 60/570,767 filed May 13, 2004 and 60/579,618 filed Jun. 15, 2004, which are incorporated by reference. In addition, this application claims the benefit of European Application Nos. 04101766.6 filed Apr. 27, 2004, and 04102654.3 filed Jun. 11, 2004 which are also incorporated by reference.

FIELD OF THE INVENTION

The present invention relates to a heat-sensitive, negative working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by crosslinking of a polymer, heat-induced solubilization, or by particle coagulation of a thermoplastic polymer latex.

Although some of these thermal processes enable plate making without wet processing, the most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-A 625728.

Negative working plate precursors which do not require a pre-heat step may contain an image-recording layer that works by heat-induced particle coalescence of a thermoplastic polymer latex, as described in e.g. EP-As 770 494, 770 495, 770 496 and 770 497. These patents disclose a method for making a lithographic printing plate comprising the steps of (1) image-wise exposing an imaging element comprising hydrophobic thermoplastic polymer particles dispersed in a hydrophilic binder and a compound capable of converting light into heat, (2) and developing the image-wise exposed element by applying fountain and/or ink. Another plate that works by latex coalescence is described in EP-A 800928 which discloses a heat-sensitive imaging element comprising on a hydrophilic support an image-forming layer comprising an infrared absorbing compound and hydrophobic thermoplastic particles dispersed in an alkali soluble or swellable resin which contains phenolic hydroxy groups. A similar plate is described in EP-A 1243413 which discloses a method for making a negative-working heat-sensitive lithographic printing plate precursor comprising the steps of (i) applying on a lithographic base having a hydrophilic surface an aqueous dispersion comprising hydrophobic thermoplastic particles and particles of a polymer B which have a softening point lower than the glass transition temperature of said hydrophobic thermoplastic particles and (ii) heating the image-recording layer at a temperature which is higher than the softening point of polymer B and lower than the glass temperature of the hydrophobic thermoplastic particles.

Such image recording layers have also been combined with additional layers as described in EP-A 881096 wherein a heat-sensitive imaging element for making a lithographic printing plate is disclosed which comprises on a lithographic base provided with a hydrophilic surface (i) an image-forming layer comprising hydrophobic thermoplastic particles and an infared absorbing agent and (ii) a barrier layer between said image-forming layer and said lithographic base comprises an alkali soluble binder which comprises phenolic or carboxylic groups or phenolic and carboxylic groups.

A recent example of a negative working thermal plate precursor has been described in WO 03/87942 which also comprises a double-layer coating. Latex coalescence, however, has not been disclosed in this document.

The major problems associated with the prior art plate materials which work according to heat-induced latex coalescence are the low run-length which is due to the ease of mechanical damage of the coating of such materials, the low chemical resistance against press liquids and/or the poor image quality.

SUMMARY OF THE INVENTION

It is an object of the present invention to provide a negative-working heat-sensitive lithographic printing plate precursor for making in a convenient way a lithographic printing plate which has excellent printing properties-i.e. high image quality and no toning-and which allows a long run-length. It is a further object of the present invention to provide a method for obtaining in a convenient way a negative-working heat-sensitive lithographic printing plate with a high run-length which provides prints without toning and with an excellent image quality, by using said precursor.

According to the present invention there is provided a negative-working lithographic printing plate precursor comprising on a support having a hydrophilic surface or which is provided with a hydrophilic layer, a coating comprising:

(i) an infrared absorbing agent, (ii) a first layer comprising an aqueous dispersion comprising hydrophobic thermoplastic polymer particles and a first hydrophobic binder, (iii) and a second layer, located between said first layer and said support, which comprises a second hydrophobic binder, characterized in that said first hydrophobic binder is a phenolic resin and said second hydrophobic binder is a polymer comprising at least one sulphonamide group.

According to the present invention it was surprisingly found that a printing plate precursor comprising the specific combination of a phenolic resin (present in a first layer) and a polymer comprising at least one sulphonamide group (present in a layer below said first layer), provides a printing plate with a high run-length that gives prints with an excellent image quality and no toning.

According to the present invention there is also provided a method for obtaining a negative-working lithographic printing plate comprising the steps of:

(i) providing a negative-working lithographic printing plate precursor as described above, (ii) imagewise exposing the coating to heat and/or infrared light, thereby reducing the capacity of said coating of being penetrated and/or solubilized by an aqueous alkaline solution, (iii) developing the imagewise exposed precursor with said aqueous alkaline solution so that the non-exposed areas are dissolved.

Further objects of the present invention will become clear from the description hereinafter.

DETAILED DESCRIPTION OF THE INVENTION

The hydrophobic thermoplastic polymer particles present in the first layer of the lithographic printing plate precursor of the present invention are selected from polyethylene, poly(vinyl)chloride, polymethyl(meth)acrylate, polyethyl (meth)acrylate, poyvinylidene chloride, poly(meth)acrylonitrile, polyvinylcarbazole, polystyrene or copolymers thereof. According to a preferred embodiment, the thermoplastic polymer particles are represented by poly(meth) acrylonitrile or derivatives thereof, or mixtures of polystyrene and poly(meth)acrylonitrile or derivatives thereof. According to a highly preferred embodiment, the thermoplastic polymer particles represented by poly(meth)acrylonitrile or derivatives thereof, or mixtures of polystyrene and poly(meth)acrylonitrile or derivatives thereof comprise at least 5 wt % of nitrogen containing units, more preferably at least 30 wt % of nitrogen containing units. The latter mixture may comprise at least 50 wt % of polystyrene, and more preferably at least 65 wt % of polystyrene. According to the most preferred embodiment, the thermoplastic polymer particles comprise styrene and acrylonitrile units in a weight ratio between 1:1 and 5:1 (styrene:acrylonitrile), e.g. in a 2:1 ratio.

The weight average molecular weight of the thermoplastic polymer particles may range from 5,000 to 1,000,000 g/mol. The hydrophobic particles preferably have a number average particle diameter below 200 nm, more preferably between 2 nm and 150 nm, most preferably between 10 and 100 nm. The amount of hydrophobic thermoplastic polymer particles contained in the first layer is preferably between 20% by weight of the total weight of the first layer and 95% by weight and more preferably between 25% by weight and 90% by weight and most preferably between 30% by weight and 88% by weight.

The thermoplastic polymer particles are present as a dispersion in an aqueous coating liquid of the top layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The first layer further comprises a first hydrophobic binder which is preferably soluble or swellable in an aqueous alkaline solution but preferably not soluble or swellable in water (i.e. at about a neutral pH). In a preferred embodiment, the first hydrophobic binder is present as particles in the aqueous dispersion. A dispersion of the first hydrophobic binder may be obtained when the pH of the dispersion is not sufficiently high to cause dissolution of the binder. The weight ratio of the thermoplastic polymer particles and the first hydrophobic binder in the aqueous dispersion of the first layer, is preferably larger than 0.8, more preferably larger than 1.0 and most preferably larger than 1.4. The thickness of the first layer is preferably at least 0.3 micron thick, more preferably at least 0.5 micron thick. The first hydrophobic binder is represented by a phenolic resin such as for example novolac, resoles and polyvinyl phenols. Typical examples of such polymers are described in DE 400 742 8, DE 402 730 1 and DE 444 582 0.

In a preferred embodiment of the present invention, the first hydrophobic binder is a phenolic resin which is chemically modified; the phenolic resin which is chemically modified is preferably a phenolic resin comprising a phenolic monomeric unit which comprises a phenyl-group and a hydroxy-group and wherein the phenyl-group or the hydroxy-group of the phenolic monomeric unit are chemically modified with an organic substituent. The phenolic resins which are chemically modified with an organic substituent may exhibit an increased chemical resistance against printing chemicals such as fountain solutions or press chemicals such as plate cleaners. Examples of such alkali-soluble phenolic resins, which are chemically modified with an organic substituent, are described in EP 934 822, EP 1 072 432, U.S. Pat. No. 5,641,608, EP 0 982 123, WO 99/01795, EP 02 102 446, filed on Oct. 15, 2002, EP-A 02 102 444, filed on Oct. 15, 2002, EP 02 102 445, filed on Oct. 15, 2002, EP 02 102 443, filed on Oct. 15, 2002, EP 03 102 522, filed on Aug. 13, 2003.

The modified resins described in EP 02 102 446, filed on Oct. 15, 2002, are preferred, specially those resins wherein the phenyl-group of the phenolic monomeric unit or the hydroxy-group of the phenolic monomeric unit is substituted with a group having the structure of formula (I) defined below. By a substituted hydroxy-group is meant that the substituent is covalently bonded to the oxygen atom of the hydroxy-group replacing the hydrogen atom.

Formula I:

(I)

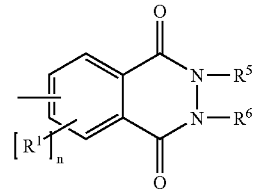

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, -M-N-phthalimidyl, or $-M-R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

Other preferred alkali-soluble phenolic resins are phenolic resins wherein the phenyl-group of the phenolic monomeric unit of said phenolic resin is substituted with a group having the structure —N=N-Q, wherein the —N=N— group is covalently bound to a carbon atom of the phenyl group and wherein Q is an aromatic group. Most preferred are the polymers wherein Q has the structure of formula (I).

The first hydrophobic binder preferably has a softening temperature below 100° C., more preferably below 75° C. and most preferably below 50° C. The glass transition temperature of the hydrophobic thermoplastic particles is preferably higher than the softening temperature of the first hydrophobic binder which allows the heating of the composition up to a temperature above the softening temperature of the first hydrophobic binder without substantially triggering the image mechanism of heat-induced fusion or coalescence of the hydrophobic thermoplastic particles. The heating to a temperature above the softening temperature of the first hydrophobic binder and preferably below the glass transition temperature of the thermoplastic hydrophobic particles, may—depending on the time and temperature of the heating step—result in a slight, a partial or complete fusing of the particles of the first hydrophobic binder which may lead to the formation of a film matrix wherein the thermoplastic hydrophobic particles are dispersed. The heating may be performed during the drying of the coated layer, or otherwise the drying may be carried out at a lower temperature, e.g. room temperature, and then the heating may be performed as a separate step after the drying.

In the first layer a difference in the capacity of being penetrated and/or solubilised by the aqueous alkaline solution is generated upon image-wise exposure with heat and/or infrared light. This difference is obtained by a thermally induced coagulation of the hydrophobic polymer particles. Coagulation may result from heat-induced coalescence, softening or melting of the thermoplastic polymer particles. The decreased capacity of the first layer of being penetrated and/or solubilised by the aqueous alkaline solution created upon laser exposure, results in a clean out of the non-imaged parts without solubilising and/or damaging the imaged parts. Furthermore, the imaged parts act as a shield for the alkali soluble layer underneath and prevents its solubilization at this areas. The development with the aqueous alkaline solution is preferably done within an interval of 5 to 120 seconds. The coagulation temperature of the hydrophobic thermoplastic particles should be sufficiently below the decomposition temperature of the polymer particles and is preferably higher than 50° C., more preferably higher than 100° C.

The second layer located between the first layer and the hydrophilic support of the printing plate precursor of the present invention, comprises a polymer comprising at least one sulphonamide group. Hereinafter, 'a polymer comprising at least one sulphonamide group' is also referred to as "a sulphonamide polymer". The sulphonamide group is preferably represented by $—NR—SO_2—$, $—SO_2—NR—$, $R—SO_2—NR'—$ or $RR'N—SO_2—$ wherein R and R' each independently represent hydrogen or an organic substituent. The sulphonamide polymer is preferably alkali soluble. The second layer may further comprise additional hydrophobic binders such as a phenolic resin (e.g. novolac, resoles or polyvinyl phenols), a chemically modified phenolic resin or a polymer containing a carboxy group, a nitrile group or a maleimide group. The thickness of the second layer is preferably at least 0.2 micrometer thick, more preferably at least 0.5 micrometer thick. Examples of suitable sulphonamide polymers are those described in EP-A 0 933 682, EP 0 894 622 (page 3 line 16 to page 6 line 30), EP-A 0 982 123 (page 3 line 56 to page 51 line 5), EP-A 1 072 432 (page 4 line 21 to page 10 line 29) and WO 99/63407 (page 4 line 13 to page 9 line 37). A preferred example is a polymer comprising N-(4-sulfamoylphenyl)maleimide units; for example a homopolymer or copolymer containing units of the formulae IIa or IIb:

(IIa)

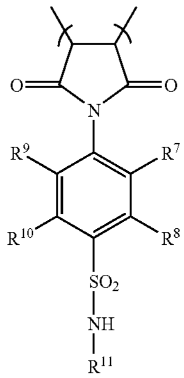

-continued (IIb)

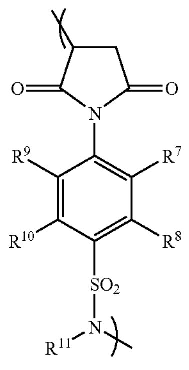

wherein $R^7$, $R^8$, $R^9$ and $R^{10}$ each independently represent hydrogen, a halogen, hydroxyl, an alkoxy and an optionally substituted alkyl or aryl group;

$R^{11}$ represents hydrogen, an optionally substituted alkyl, alkanoyl, alkenyl, alkynyl, cycloalkyl, heterocyclic, aryl, heteroaryl, aralkyl or heteroaralkyl group, a group of the formula —C(═N)—NH—$R^{12}$ or an optionally substituted iso- or heterocyclic radical having 1 to 20 carbon atoms wherein the thiazolyl radical is excluded. The isocyclic or heterocyclic radicals $R^{11}$ may contain a plurality (in general two to three) fused or unfused rings. Preferably, $R^{11}$ represents a monocylic or bicyclic radical. The heteroatoms present in the heterocyclic radicals are preferably oxygen, sulfur and/or nitrogen atoms. Heterocyclic radicals containing one ring, such as a five-membered ring or a six-membered ring, are preferred examples. This ring may contain one or two nitrogen atoms and optionally also an oxygen atom; examples of such heterocyclic radicals are morpholin-2- and -3-yl, pyridin-2-, -3- and -4-yl and pyrimidin-2- and -4-yl. $R^{12}$ represents hydrogen or an optionally substituted alkyl or aryl group.

The substituents optionally present in the alkyl and aryl groups of $R^7$ to $R^{10}$ and $R^{12}$ may be represented by a halogen such as a chlorine or bromine atom, or a hydroxyl group. The substituents optionally present in the iso-or heterocyclic radical $R^{11}$ may be represented by a halogen atom, a hydroxyl, amino, alkylamino, dialkylamino, alkoxy or alkyl group.

A preferred example of a polymer comprising N-(4-sulfamoylphenyl) maleimide units according to formula IIa or formula IIb are homopolymers or copolymers wherein $R^7$, $R^8$, $R^9$ and $R^{10}$ each independently represent hydrogen or an optionally substituted alkyl group; the substituents optionally present in the alkyl groups of $R^7$ to $R^{10}$ may be represented by a halogen such as a chlorine or bromine atom or a hydroxyl group.

$R^{11}$ represents hydrogen, an alkyl, alkanoyl, alkenyl, alkynyl, cycloalkyl, heterocyclic, aryl, heteroaryl, aralkyl or heteroaralkyl group;

Suitable preparation methods of the polymers described above comprising N-(4-sulfamoylphenyl) maleimide units according to the formulae IIa or IIb, are described in EP 0 933 682.

Another preferred example of a polymer which comprises at least one sulphonamide group and which is preferably alkali soluble, is a homopolymer or copolymer comprising a structural unit represented by the following general formula (III):

(III)

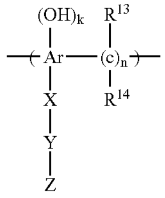

wherein

Ar represents an optionally substituted aromatic hydrocarbon ring; preferred examples of an optionally substituted aromatic hydrocarbon ring are a benzene ring, a naphthalene ring or an anthracene ring. Preferred substituents on the aromatic hydrocarbon ring include a halogen, an optionally substituted alkyl group having up to 12 carbon atoms, an optionally substituted alkoxy, alkylthio, cyano, nitro or trifluoromethyl group;

n=0 or 1;

$R^{13}$ and $R^{14}$ each independently represent hydrogen or a hydrocarbon group having up to 12 carbon atoms, preferably $R^{13}$ and $R^{14}$ are each represented by hydrogen or a methyl group;

k is an integer between 0 and 3;

X represents a single bond or a divalent linking group. The divalent linking group may contain up to 20 carbon atoms and may contain at least one atom selected from C, H, N, O and S. Preferred divalent linking groups are a linear alkylene group having 1 to 18 carbon atoms, a linear, branched, or cyclic group having 3 to 18 carbon atoms, an alkynylene group having 2 to 18 carbon atoms and an arylene group having 6 to 20 atoms, —O—, —S—, —CO—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—$NR^i$—, a phenylene group, a naphtalene group, an anthracene group, a heterocyclic group, or combinations thereof, wherein $R^h$ and $R^i$ are each independently represented by hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group. Preferably X is a methylene group, an ethylene group, a propylene group, a butylene group, an isopropylene group, cyclohexylene group, a phenylene group, a tolylene group or a biphenylene group;

Y is a bivalent sulphonamide group represented by —$NR^j$—$SO_2$— or —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group, or a group of the formula —C(═N)—NH—$R^{15}$, wherein $R^{15}$ represents hydrogen or an optionally substituted alkyl or aryl group;

Z represents a bi-, tri- or quadrivalent linking group or a terminal group. When Z is a bi-, tri- or quadrivalent linking group, the remaining 1 to 3 bonds of Z are linked to Y forming crosslinked structural units.

When Z is a terminal group, it is preferably hydrogen or an optionally substituted linear, branched, or cyclic alkylene or alkyl group having 1 to 18 carbon atoms such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, an arylene or aryl group having 6 to 20 carbon atoms; a linear, branched, or cyclic alkenylene or alkenyl group having 2 to 18 carbon atoms, a linear, branched, or cyclic alkynylene or alkynyl group having 2 to 18 carbon atom or an alkoxy group. Examples of preferred substituent groups optionally present on Z are an alkoxy group having up to 12 carbon atoms, a halogen atom or a hydroxyl group.

When Z is a bi, tri- or quadrivalent linking group, it is preferably represented by an above mentioned terminal group of which hydrogen atoms in numbers corresponding to the valence are eliminated therefrom.

The structural unit represented by the general formula (III) has preferably the following groups:

Ar represents an optionally substituted aromatic benzene ring or naphthalene ring;

n=0 or 1;

$R^{13}$ and $R^{14}$ each independently represent hydrogen or a methyl group;

k is an integer between 0 and 3;

X represents an alkylene, cyclohexylene, phenylene or tolylene group, —O—, —S—, —CO—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—$NR^i$—, wherein $R^h$ and $R^i$ each independently represent hydrogen or an optionally substituted alkyl, alkenyl, alkynyl, cycloalkyl, heterocyclic, aryl, heteroaryl, aralkyl or heteroaralkyl group;

preferred substituents on the latter groups are an alkoxy group having up to 12 carbon atoms, a halogen or a hydroxyl group;

Y is a bivalent sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group;

Z is a terminal group represented by hydrogen, a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, a benzyl group, a phenyl group, a naphtyl group, an anthracenyl group, an allyl group or a vinyl group.

Another preferred example of a polymer which comprises at least one sulphonamide group and which is preferably alkali soluble, is a homopolymer or copolymer comprising a structural unit represented by the following general formula (IV):

(IV)

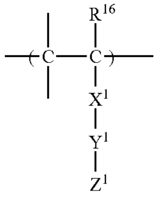

wherein:

$R^{16}$ represents hydrogen or a hydrocarbon group having up to 12 carbon atoms; preferably $R^{16}$ represents hydrogen or a methyl group;

$X^1$ represents a single bond or a divalent linking group. The divalent linking group may have up to 20 carbon atoms and may contain at least one atom selected from C, H, N, O and S.

Preferred divalent linking groups are a linear alkylene group having 1 to 18 carbon atoms, a linear, branched, or cyclic group having 3 to 18 carbon atoms, an alkynylene group having 2 to 18 carbon atoms and an arylene group having 6 to 20 atoms, —O—, —S—, —Co—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—NR —, a phenylene group, a naphtalene group, an anthracene group, a heterocyclic group, or combinations thereof, wherein $R^h$ and $R^i$ each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group. Preferably $X^1$ is a methylene group, an ethylene group, a propylene group, a butylene group, an isopropylene group, cyclohexylene group, a phenylene group, a tolylene group or a biphenylene group;

$Y^1$ is a bivalent sulphonamide group represented by —$NR^j$—$SO_2$— or —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group or a group of the formula —C(=N)—NH—$R^{15}$, wherein $R^{15}$ represents hydrogen or an optionally substituted alkyl or aryl group;

$Z^1$ represents a bi-, tri- or quadrivalent linking group or a terminal group. When $Z^1$ is a bi-, tri- or quadrivalent linking group, the remaining 1 to 3 bonds of $Z^1$ are linked to $Y^1$ forming crosslinked structural units.

When $Z^1$ is a terminal group, it is preferably represented by hydrogen or an optionally substituted linear, branched, or cyclic alkylene or alkyl group having 1 to 18 carbon atoms such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, an arylene or aryl group having 6 to 20 carbon atoms; a linear, branched, or cyclic alkenylene or alkenyl group having 2 to 18 carbon atoms, a linear, branched, or cyclic alkynylene or alkynyl group having 2 to 18 carbon atom or an alkoxy group.

When Z is a bi, tri- or quadrivalent linking group, it is preferably represented by an above mentioned terminal group of which hydrogen atoms in numbers corresponding to the valence are eliminated therefrom.

Examples of preferred substituent groups optionally present on $Z^1$ are an alkoxy group having up to 12 carbon atoms, a halogen atom or a hydroxyl group.

The structural unit represented by the general formula (IV) has preferably the following groups:

$X^1$ represents an alkylene, cyclohexylene, phenylene or tolylene group, —O—, —S—, —CO—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—$NR^i$—, wherein $R^h$ and $R^i$ each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group;

$Y^1$ is a bivalent sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group;

$Z^1$ is a terminal group represented by hydrogen, a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, a benzyl group, a phenyl group, a naphtyl group, an anthracenyl group, an allyl group or a vinyl group.

Specific examples of the structural units are the following structures:

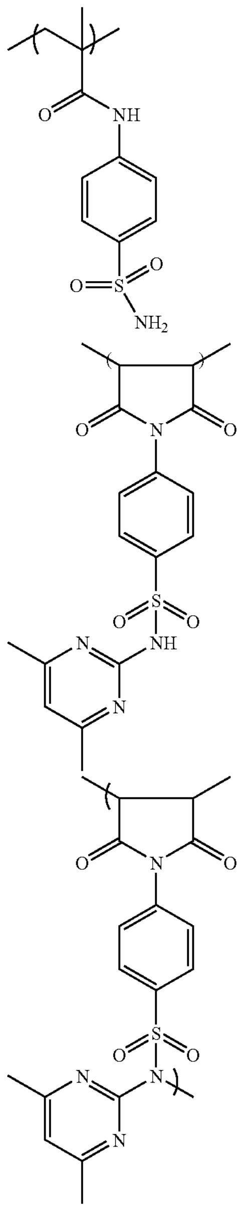

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support i s an is electrochemically grained and anodized aluminum support. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminium support, both the adhesion of the printing image and the wetting characteristics of the non-image areas are improved. By varying the type and/or concentration of the electrolyte and the applied voltage in the graining step, different type of grains can be obtained.

By anodising the aluminium support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminum surface) varies between 1 and 8 $g/m^2$.

The grained and anodized aluminum support may be post-treated to improve the hydrophilic properties of its surface. For example, the aluminum oxide surface may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydrocarboxylic acids, sulphonic acids or phosphonic acids, or their salts, e.g. succinates, phosphates, phosphonates, sulphates, and sulphonates. A citric acid or citrate solution is preferred. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight. The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

According to another embodiment the base layer may also comprise $Al_2O_3$ and an optional binder. Deposition methods for the $Al_2O_3$ onto the flexible support may be (i) physical vapor deposition including reactive sputtering, RF-sputtering, pulsed laser PVD and evaporation of aluminium, (ii) chemical vapor deposition under both vacuum and non-vacuum condition, (iii) chemical solution deposition including spray coating, dipcoating, spincoating, chemical bath deposition, selective ion layer adsorption and reaction, liquid phase deposition and electroless deposition. The $Al_2O_3$ powder can be prepared using different techniques including flame pyrolisis, ball milling, precipitation, hydrothermal synthesis, aerosol synthesis, emulsion synthesis, sol-gel synthesis (solvent based), solution-gel synthesis (water based) and gasphase synthesis. The particle size of the $Al_2O_3$powders can vary between 2 nm and 30 μm; more preferably between 100 nm and 2 μm.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides.

Particular examples of suitable hydrophilic base layers for use in accordance with the present invention are disclosed in EP 601240, GB 1419512, FR 2300354, U.S. Pat. No. 3,971,660, and U.S. Pat. No. 4,284,705.

The coating preferably also contains a compound which absorbs infrared light and converts the absorbed energy into heat. The concentration of the IR absorbing compound in the coating is typically between 0.25 and 10.0 wt. % , more preferably between 0.5 and 7.5 wt. %. The infrared absorbing compound can be present in the first layer and/or the second layer and/or an optionally other layer. Preferred IR absorbing compounds are dyes such as cyanine and merocyanine dyes or pigments such as carbon black. Examples of suitable IR absorbers are described in e.g. EP 823327, 978376, 1029667, 1053868, 1093934; WO 97/39894 and 00/29214. A preferred compound is the following cyanine dye:

IR-1

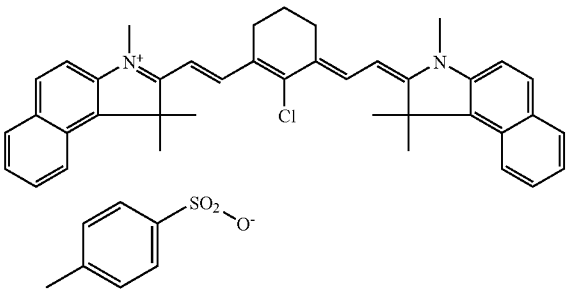

To protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

Optionally, the coating may further contain additional ingredients. For example, colorants can be added such as dyes or pigments which provide a visible colour to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonylblau 640, auramine and malachite green. Polymers particles such as matting agents and spacers are also well known components of lithographic coatings which can be used in the plate precursor of the present invention.

The printing plate precursor of the present invention can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor of the present invention is preferably not sensitive to visible light. Most preferably, the coating is not sensitive to ambient daylight, i.e. visible (400-750 nm) and near UV light (300-400 nm) at an intensity and exposure time corresponding to normal working conditions so that the material can be handled without the need for a safe light environment.

The printing plate precursor of the present invention can be exposed to infrared light by means of e.g. LEDs or a laser. Most preferably, the light used for the exposure is a laser emitting near infrared light having a wavelength in the range from about 750 to about 1500 nm, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e.

the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters for thermal plates having a typical laser power from about 20 mW to about 500 mW operate at a lower scan speed, e.g. from 0.1 to 20 m/sec. The Creo Trendsetter plate-setter family (trademark of Creo) and the Agfa Excalibur plate-setter family (trademark of Agfa Gevaert N.V.) both make use of the XTD-technology.

The known plate-setters can be used as an off-press exposure apparatus, which offers the benefit of reduced press downtime. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

In the development step, the non-exposed areas of the first layer and the corresponding parts of the underlying layer are removed by supplying an aqueous alkaline developer, which may be combined with mechanical rubbing, e.g. by a rotating brush. The development step may be followed by a drying step, a rinsing step and/or a gumming step. The plate precursor can, if required, then be post-treated with a suitable correcting agent or preservative as known in the art. To increase the resistance of the finished printing plate and hence to extend the print run, the layer can be briefly heated at a temperature which is higher than the glass transition temperature of the thermoplastic particles, e.g. between 100° C. and 230° C. for a period of 40 minutes to 5 minutes ("baking") For example, the exposed and developed plates can be baked at a temperature of 230° C. for 5 minutes, at a temperature of 150° C. for 10 minutes or at a temperature of 120° C. for 30 minutes. As a result of this baking step, the resistance of the printing plate to washout agents, correction agents and UV-curable printing inks increases. Such a thermal post-treatment is described, inter alia, in DE 14 47 963 and GB 1 154 749.

The printing plate thus obtained can be used for conventional, so-called wet offset printing, in which ink and an aqueous dampening liquid are supplied to the plate. Another suitable printing method uses so-called single-fluid ink without a dampening liquid. Single-fluid inks which are suitable for use in the method of the present invention have been described in U.S. Pat. Nos. 4,045,232; 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

In the Examples the printing plate precursors are obtained by coating two layers on a substrate as follows: firstly, a coating solution is applied onto the lithographic base and dried, and subsequently, another coating solution is applied on top of this dried layer. The solvent used to apply the coatings is a mixture of 50% methylethyl ketone (MEK)/50% Dowanol PM (1-methoxy-2-propanol from Dow Chemical Company).

Preparation of Sulphonamide Polymer SP-01.

Reaction products

SP-01 was prepared using 3 monomers, i.e. 4-(2,5-dihydro-2,5-dioxo-1H-pyrrol-1-yl)—N—(4,6-dimethyl-2-pyrimidinyl)-benzenesulfonamide (monomer 1), benzyl maleimide (monomer 2) and (4-hydroxy-3,5-dimethylbenzyl) methacrylamide (monomer 3). A 50% solution of 2,2-di (tert.butylperoxy)butane in isododecane/methyl-ethyl ketone was used as initiator. This initiator was obtained under the trade name Trigonox D-C50 from Akzo Nobel, Amersfoort, The Netherlands.

monomer 1=CASRN 233761-16-5 monomer 2=CASRN 1631-26-1 monomer 3=CASRN 104835-82-7

Synthesis of SP-01.

A jacketed 10 liter reactor equipped with a condenser cooled with cold water and nitrogen inlet was filled with the 651.55 g of butyrolactone. The reactor was stirred at 100 rpm using a rotor blade stirrer. Subsequently the monomers were added, i.e. 465.86 g of monomer 1, 224.07 g of monomer 2 and 294.07 g of monomer 3. The residual monomer still present in the bottles is disssolved/dispersed in 300 g butyrolactone and added to the reactor. The stirring speed is then raised to 130 rpm. Subsequently the reactor was purged with nitrogen. The reactor was heated to 140° C. during 2.5 hours and stabilized at 140° C. during 30 minutes. Afterwards the monomers are dissolved and a dark brown solution is obtained. Subsequently 36.86 g of the 50 weight % initiator solution was added during 2 hours. Whereas the reaction is exothermic, the reactor is cooled in order to stay at 140° C. After adding of the initiator the rotation speed is raised to 150 rpm. The reaction mixture is stirred for an additional 19 hours. Afterwards, the reactor content was cooled to 110° C. and the polymer solution was diluted using 2010 g of Dowanol PM (1-methoxy-2-propanol). The reaction mixture was allowed to cool further during the addition of the cold methoxypropanol in a period of 5 minutes. Subsequently the reactor was cooled further to room temperature and the resulting 25 weight % polymer solution was collected in a drum.

Comparative Example 1

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 μm, measured with a TALYSURF 10 apparatus from TAYLOR HOBSON Ltd.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water, posttreated with a solution containing polyvinylphosphonic acid (2.2 $g/m^2$).

Preparation of the Printing Plate Precursor

The printing plate precursor was produced by first coating the coating defined in Table 1 onto the above-described lithographic base. The coating was applied at a wet coating thickness of 20 μm and then dried at 130° C. for two minutes. The dry coating weight was 0.3 g/$m^2$.

TABLE 1

| Composition of the first coating (g/$m^2$). | |
|---|---|
| INGREDIENTS | Parts g/$m^2$ |
| Alnovol SP452 (1) | 0.270 |
| Tri-methoxybenzoic acid | 0.030 |

(1) Alnovol SPN452 is a 40.5 wt. % solution of novolac in Dowanol PM (commercially available from Clariant).

Onto the dried coated printing plate precursor, a second coating as defined in Table 2 was coated at a wet coating thickness of 30 μm and dried at 60° C. for two minutes. The dry coating weight was 0.7 g/$m^2$.

TABLE 2

| Composition of the second coating. | |
|---|---|
| INGREDIENTS | Parts g/$m^2$ |
| Polyacrylic acid (1) | 0.090 |
| Polystyrene latex (2) | 0.0450 |
| IR dye (3) | 0.060 |

(1) Glascol D15 from Allied Colloids (Mw = 2.7 · $10^7$ g/mol)
(2) Polystyrene latex, 67 nm particle size
(3) carbon black dispersion Imaging and Processing of the Printing Plate Precursors The printing plate precursor was then imaged on a CREO TRENDSETTER 3244 T, a plate-setter available from CREO, Burnaby, Canada, at 2450 dpi with a 200 lpi screen at an energy density of 220 mJ/$m^2$. After imaging, the plates were developed in an AUTOLITH T processor, available from AGFA-GEVAERT NV, operating at 25° C., in TD 5000 as developing solution (trademark form Agfa Gevaert N.V.).

Print Results

The plates obtained after processing, were used as a printing master and mounted on a Heidelberg GTO46 printing press available from Heidelberger Druckmaschinen AG, Heidelberg, Germany. K+E Novavit 800 Skinnex was used as ink, and 4% of Combifix XL/10% of isopropanol as fountain solution; both commercially available from BASF Drucksysteme GmbH. The image quality was determined by measuring the maximum highlight rendering (i.e. % dot area) of a 200 lpi screen on the print after 1000 prints. The maximum highlight rendering was 5% @200 lpi indicating a low image quality.

Comparative Examples 2-4

Preparation of the Lithographic Base

A 0.30 mm thick aluminum foil AA1050, commercially available from ALCAN, was degreased by immersing the foil in an aqueous solution containing 34 g/l of sodium hydroxide at 70° C. for 6 seconds and rinsed with demineralized water for 2 seconds. The foil was then electrochemically grained using an alternating electric current in an aqueous solution containing 12 g/l of hydrochloric acid and 9 g/l of aluminum sulphate at a temperature of 37° C. and a current density of 105 A/$dm^2$. The aluminum foil was then rinsed with demineralized water and desmutted in an aqueous solution containing 145 g/l of sulfuric acid at 80° C. for 8 seconds. The grained aluminum foil was subsequently subjected to DC anodic oxidation in an aqueous solution containing 145 g/l of sulfuric acid at a temperature of 57° C., at a current density of 30 A/$dm^2$ to form an anodic oxidation film of 4.09 g/$m^2$ of $Al_2O_3$, measured by gravimetric experiments. The foil has a surface topography with an average center-line roughness Ra of 0.25 μm, measured with a TALYSURF 10 apparatus from TAYLOR HOBSON Ltd.

Preparation of the Printing Plate Precursors 2-4

The printing plate precursors were produced by first coating the coating defined in Table 3 onto the above-described lithographic base. The coating was applied at a wet coating thickness of 30 μm and then dried at 130° C. for two minutes. The dry coating weight was 0.25 g/$m^2$.

TABLE 3

| Composition of the first coating (g/$m^2$). | |
|---|---|
| INGREDIENTS | Parts (g) |
| Alnovol SPN452 (1) | 0.185 |
| Trimethoxy benzoic acid | 0.035 |
| PVCB (2) | 0.030 |

(1) Alnovol SPN452 is a 40.5 wt. % solution of novolac in Dowanol PM (commercially available from Clariant).
(2) Phtalic anhydride modified polyvinylalcohol. The polymer is obtained from the reaction of polyvinyl alcohol (98% hydrolyzed polyvinylacetate) with phtalic anhydride; 55 mol % of the hydroxylic groups are modified with phtalic anhydride.

Onto the dried coated printing plate precursor a second coating as defined in Table 4 was coated at a wet coating thickness of 30 μm and dried at 60° C. for two minutes. The dry coating weight was 0.7 g/$m^2$.

TABLE 4

| Composition of the second coating (g/$m^2$) | | | |
|---|---|---|---|
| INGREDIENTS G | Comparative Example 2 | Comparative Example 3 | Comparative Example 4 |
| Polyacrylic acid (1) | / | / | 0.105 |
| Polyacrylonitrile/ polystyrene latex (2) | 0.381 | 0.634 | 0.490 |
| Alnovol SPN452 (3) | 0.253 | / | / |
| S0094 IR-1 (4) | 0.066 | 0.066 | 0.105 |

(1) Glascol D15 from Allied Colloids, molecular weight 2.7 × $10^7$ g/mol;
(2) a latex copolymer of styrene and acrylonitrile (weight ratio 60/40) having an average particle size of 65 nm, stabilized with an anionic wetting agent;
(3) Alnovol SPN452 is a 40.5 wt. % solution of novolac in Dowanol PM; commercially available from Clariant;
(4) cyanine dye commercially available from FEW Chemicals; S0094 has the chemical structure as IR-1 shown above.

Imaging and Processing of the Printing Plate Precursors

The printing plate precursors were exposed with a CREO TRENDSETTER 3244 T (plate-setter trademark of CREO, Burnaby, Canada) operating at 2450 dpi at an energy density of 220 mJ/$cm^2$ using a 200 lpi screen.

After imaging, the plates were developed using an AUTOLITH T processor, available from AGFA-GEVAERT NV, operating at 25° C., in TD 5000 as developing solution (trademark form Agfa Gevaert N.V.).

Print Results

The plates obtained after processing, were used as a printing master and mounted on a Heidelberg GTO46 printing press available from Heidelberger Druckmaschinen AG, Heidelberg, Germany. K+E Novavit 800 Skinnex was used as ink, and 4% of Combifix XL/10% of isopropanol as fountain solution; both commercially available from BASF Drucksysteme GmbH. The results of toning and the image quality (% highlights @200 lpi, defined above) are given in Table 5.

TABLE 5 printing results: toning behaviour and max. highlight rendering on print at 200 lpi.

| Results | Toning behaviour | % highlights @200 lpi |
|---|---|---|
| Comparative Example 2 | no toning | 3% |
| Comparative Example 3 | no toning | 4% |
| Comparative Example 4 | Toning | 4% |

All Comparative Examples 2 to 4 have a 3 to 4% highlight rendering at 200 lpi indicating a low image quality. Example 4 showed toning.

Comparative Examples 5-7 and Invention Examples 8 and 9

Preparation of the Lithographic Base

The preparation of the lithographic support for the Comparative Examples 5-7 and Invention Examples 8 and 9 was carried out in the same way as described for the Comparative Examples 2-4.

Preparation of the Printing Plate Precursors 5-9

The printing plate precursors were produced by first coating the coating defined in Table 6 onto the above described lithographic base. The coating was applied at a wet coating thickness of 30 μm and then dried at 130° C. for two minutes. The dry coating weight was 0.25 g/m$^2$ for Comparative Examples 5 and 6 and for Invention Example 8; the dry coating weight was 0.5 g/m$^2$ for Comparative Example 7 and for Invention Example 9.

TABLE 6

Composition of the first coating (g/m$^2$).

| INGREDIENTS G | Comp. Example 5 | Comp. Example 6 | Comp. Example 7 | Invention Example 8 | Invention Example 9 |
|---|---|---|---|---|---|
| Alnovol SPN452 (1) | 0.220 | 0.250 | 0.44 | / | / |
| Tri-methoxy benzoic acid | 0.03 | / | 0.06 | / | / |
| SP-01 (2) | / | / | / | 0.25 | 0.50 |

(1) Alnovol SPN452 is a 40.5 wt. % solution of novolac in Dowanol PM (commercially available from Clariant).
(2) Sulphonamide polymer, preparation see above.

Onto the dried coated printing plate precursor a second coating as defined in Table 7 was coated at a wet coating thickness of 30 μm and dried at 60° C. for two minutes. The dry coating weight was 0.7 g/m$^2$.

TABLE 7

Composition of the second coating (g/m$^2$)

| INGREDIENTS g | Examples 5-9 |
|---|---|
| Polyacrylonitrile/styrene latex (1) | 0.381 |
| Alnovol SPN452 (2) | 0.253 |
| S0094 IR-1 (3) | 0.066 |

(1) a latex copolymer of styrene and acrylonitrile (weight ratio 60/40) having an average particle size of 65 nm, stabilized with an anionic wetting agent;
(2) Alnovol SPN452 is a 40.5 wt. % solution of novolac in Dowanol PM (commercially available from Clariant);
(3) cyanine dye commercially available from FEW Chemicals. S0094 has the chemical structure as IR-1 shown above.

Processing and Imaging of the Printing Plate Precursors

The printing plate precursors were exposed and developed as described in the Comparative Examples 2-4.

Print Results

Printing was carried out in the same way as described for Comparative Examples 2-4. The results of toning and the maximum highlight rendering (defined above) are given in Table 8.

TABLE 8 printing results: toning behaviour and max. highlight rendering on print at 200 lpi.

| Results | Toning behaviour | % highlights @200 lpi |
|---|---|---|
| Comp. Example 5 | No toning | 3% |
| Comp. Example 6 | Toning | nd* |
| Comp. Example 7 | No toning | 4-5% |
| Invention Example 8 | No toning | 1% |
| Invention Example 9 | No toning | 1% |

*nd: not determined

The results summarised in Table 8 indicate that Invention Examples 8 and 9 give print results without toning and a 1% highlight rendering at @200 lpi indicating an excellent image quality.

Invention Examples 10-13

Preparation of the Lithographic Base

The preparation of the lithographic support for the Invention Examples 10-13 was carried out in the same way as described for the Comparative Examples 2-7 and Invention Examples 8 and 9.

Preparation of the Printing Plate Precursors 10-14

The printing plate precursors were produced by first coating the coating defined in Table 9 onto the above described lithographic base. The coating solution (comprising a mixture of isopropanol/water for Invention Examples 11 and 13 and for Invention Examples 10 and 12 only water) was applied at a wet coating thickness of 30 μm and then dried at 130° C. for two minutes. The dry coating weight was 0.5 g/m$^2$ for invention Examples 10 and 11 and 0.1 g/m$^2$ for invention Examples 12 and 13.

TABLE 9

| Composition of the first coating ($g/m^2$). | | | | |
|---|---|---|---|---|
| INGREDIENTS G | Invention Example 10 | Invention Example 11 | Invention Example 12 | Invention Example 13 |
| Flexo-blau 630 (1) | 0.02 | 0.02 | 0.02 | 0.02 |
| SP-01 (2) | 0.48 | 0.48 | 0.98 | 0.98 |

(1) Flexo-blau 630 Staubarm commercially available from BASF.
(2) Sulphonamide polymer, preparation see above.

Onto the dried coated printing plate precursor a second coating as defined in Table 10 was coated at a wet coating thickness of 30 μm and dried at 60° C. for two minutes. The dry coating weight was 0.7 $g/m^2$.

TABLE 10

| Composition of second coating ($g/m^2$). | | |
|---|---|---|
| INGREDIENTS g | Invention Examples 10-11 | Invention Example 12-13 |
| Polyacrylonitrile styrene latex (1) | 0.420 | 0.525 |
| Alnovol SPN452 (2) | 0.210 | 0.070 |
| S0094 IR-1 (3) | 0.070 | 0.035 |

(1) a latex copolymer of styrene and acrylonitrile (weight ratio 60/40) having an average particle size of 65 nm, stabilized with an anionic wetting agent;
(2) Alnovol SPN452 is a 40.5 wt. % solution of novolac in Dowanol PM (commercially available from Clariant);
(3) cyanine dye commercially available from FEW Chemicals. S0094 has the chemical structure IR-1 shown above.

Processing and Imaging of the Printing Plate Precursors

The printing plate precursors were exposed and developed as described in the Comparative Examples 2-7 and Invention Examples 8 is and 9.

Print Results

Printing was carried out in the same way as described for Comparative Examples 2-7 and Invention Examples 8 and 9. The results of toning and image quality (defined above) are given in Table 11.

TABLE 11

| toning behaviour and max. highlight rendering on print at 200 lpi. | | |
|---|---|---|
| Results | Toning behaviour | % highlights @200 lpi |
| Invention Example 10 | no toning | 1% |
| Invention Example 11 | no toning | 1% |
| Invention Example 12 | no toning | 1% |
| Invention Example 13 | no toning | 1% |

The results indicate that all Invention Examples 10-13 give prints with an excellent image quality (% highlight rendering at 200 lpi is low) without toning.

Invention Example 14

The printing plate precursor of Invention Example 13 was mounted on a Sakmai Oliver 52 press using K+E Novavit 800 Skinnex available from BASF Drucksysteme GmbH as ink and Emerald premium 4% as fountain. After 100,000 prints the 1% highlight of a 200 lpi screen was still rendered on the print indicating an excellent run lenght resistance.

CONCLUSIONS

The results of the Examples illustrate that precursors comprising the combination of a phenolic resin in one layer and a polymer comprising at least one sulphonamide group in another layer, give plates with a high run-length and provide prints whithout toning and a % highlights @200 lpi significant lower (1%) compared to the comparative Examples (3% to 5%) indicating a significant improved image quality.

We claim:

1. A negative-working lithographic printing plate precursor comprising on a support having a hydrophilic surface or which is provided with a hydrophilic layer, a coating comprising:

(i) an infrared absorbing agent, (ii) a first layer comprising hydrophobic thermoplastic polymer particles dispersed in a first hydrophobic binder, (iii) and a second layer between said first layer and said hydrophilic support wherein said second layer comprises a second hydrophobic binder, wherein said first hydrophobic binder is a phenolic resin and said second hydrophobic binder is a polymer comprising at least one sulphonamide group.

2. A negative-working lithographic printing plate precursor according to claim 1 wherein the second hydrophobic binder comprises a monomeric unit represented by the following formulae IIa or IIb:

(IIa)

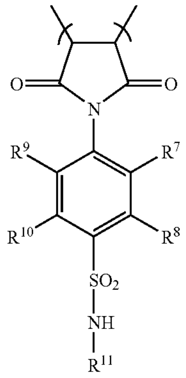

(IIb)

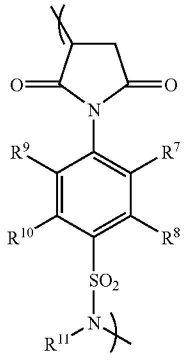

wherein $R^7$, $R^8$, $R^9$ and $R^{10}$ each independently represent hydrogen, a halogen, hydroxyl, an alkoxy or an optionally substituted alkyl or aryl group;

$R^{11}$ represents hydrogen, an optionally substituted alkyl, alkanoyl, alkenyl, alkynyl, cycloalkyl, heterocyclic, aryl, heteroaryl, aralkyl or heteroaralkyl group, a group of the formula —C(=N)—NH—$R^{12}$ or an iso- or heterocyclic radical having 1 to 20 carbon atoms wherein a thiazolyl radical is excluded; and $R^{12}$ represents hydrogen or an optionally substituted alkyl or aryl group.

3. A negative-working lithographic printing plate precursor according to claim 1 wherein the second hydrophobic binder comprises a monomeric unit represented by the following formula III:

(III)

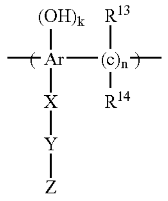

wherein:

Ar represents an optionally substituted aromatic hydrocarbon ring;

n =0 or 1;

$R^{13}$ and $R^{14}$ each independently represent hydrogen or a hydrocarbon group having up to 12 carbon atoms;

k is an integer between 0 and 3;

X represents a single bond or a divalent linking group;

Y is a bivalent sulphonamide group represented by —$NR^j$—$SO_2$— or —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group, or a group of the formula —C(=N)—NH—$R^{15}$, wherein $R^{15}$ represents hydrogen or an optionally substituted alkyl or aryl group; and Z represents a terminal group.

4. A negative-working lithographic printing plate precursor according to claim 1 wherein the second hydrophobic binder comprises a polymer comprising a monomeric unit represented by the following formula IV:

(IV)

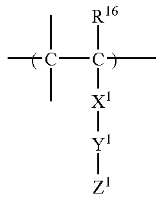

wherein:

$R^{16}$ represents hydrogen or a hydrocarbon group having up to 12 carbon atoms;

$X^1$ represents a single bond or divalent linking group;

$Y^1$ is a bivalent sulphonamide group represented by —$NR^j$—$SO_2$— or —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group or a group of the formula —C(=N)—NH—$R^{15}$, wherein $R^{15}$ represents hydrogen or an optionally substituted alkyl or aryl group; and $Z^1$ represents a terminal group.

5. A negative-working lithographic printing plate precursor according to claim 1 wherein the phenolic resin is selected from a novolac resin, a resol resin or a polyvinyl phenol polymer.

6. A negative-working lithographic printing plate precursor according to claim 5 wherein the phenolic resin comprises a phenolic monomeric unit having a phenyl-group and a hydroxy- group, and wherein said phenyl-group or said hydroxy-group is chemically modified with an organic substituent.

7. A negative-working heat-sensitive lithographic printing plate precursor according to claim 6 wherein said organic substituent comprises the following formula I:

(I)

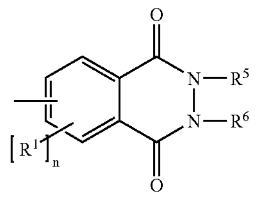

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(=O)(—O—$R^2$)(—O—$R^3$),—$NR^2$—$R^3$, —O—$R^2$, —S—$R^2$, —CN, —$NO_2$,a halogen, —N-phthalimidyl, -M-N-phthalimidyl, or -M-$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

8. A negative-working working heat-sensitive lithographic printing plate precursor according to claim 6 wherein the phenyl-group of the phenolic monomeric unit of said phenolic resin is substituted with a group having the structure —N=N-Q, wherein the —N=N— group is covalently bound to a carbon atom of the phenyl group and wherein Q has the structure of formula I (I)

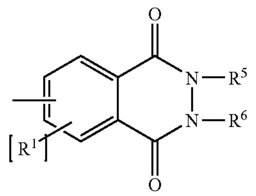

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $-SO_2-NH-R^2$, $-NH-SO_2-R^4$, $-CO-NR^2-R^3$, $-NR^2-CO-R^4$, $-O-CO-R^4$, $-CO-O-R^2$, $-CO-R^2$, $-SO_3-R^2$, $-SO_2-R^2$, $-SO-R^4$, $-P(=O)(-O-R^2)(-O-R^3)$, $-NR^2-R^3$, $-O-R^2$, $-S-R^2$, $-CN$, $-NO_2$, a halogen, —N-phthalimidyl, -M-N-phthalimidyl, or -M-$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

9. A negative-working lithographic printing plate precursor according to claim 1 wherein the first layer has a thickness of at least 0.3 micrometer.

10. A negative-working lithographic printing plate precursor according to claim 1 wherein the hydrophobic thermoplastic polymer particles comprise polyethylene, poly (vinyl)chloride, polymethyl(meth)acrylate, polyethyl (meth) acrylate, poyvinylidene chloride, poly(meth)acrylonitrile, polyvinylcarbazole, polystyrene or copolymers thereof.

11. A method for preparing a negative-working lithographic printing plate comprising the steps of:

(i) providing a negative working printing plate precursor according to claim 1, (ii) imagewise exposing the coating to heat and/or infrared light, thereby reducing the capacity of said coating of being penetrated and/or solubilized by an aqueous alkaline solution, (iii) developing the imagewise exposed precursor with said aqueous alkaline solution thereby dissolving the non-exposed areas.

* * * * *